(12) United States Patent
Chen et al.

(10) Patent No.: US 6,424,540 B1
(45) Date of Patent: Jul. 23, 2002

(54) COMPUTER ENCLOSURE INCORPORATING MEANS FOR POSITIONING A CIRCUIT BOARD

(75) Inventors: Yun-Long Chen, Chung-Ho; Yu-Tai Liu, Hsin-Chuang; Kuang-Yu Chen, Tu-Chen; Alvin Liu, Pa-Li, all of (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 09/512,743

(22) Filed: Feb. 24, 2000

(30) Foreign Application Priority Data

Dec. 31, 1999 (TW) ........................................ 88222605 U

(51) Int. Cl.⁷ .................................................. H05K 5/00
(52) U.S. Cl. ........................ 361/759; 361/816; 361/818; 174/35 R
(58) Field of Search ................................. 361/752, 753, 361/759, 800, 816, 818; 174/35 R

(56) References Cited

U.S. PATENT DOCUMENTS

| | | | | |
|---|---|---|---|---|
| 5,191,513 A | * | 3/1993 | Sugiura et al. | 361/399 |
| 5,452,184 A | * | 9/1995 | Scholder et al. | 361/799 |
| 5,691,504 A | * | 11/1997 | Sands et al. | 174/35 R |
| 5,732,450 A | * | 3/1998 | Quah et al. | 24/297 |
| 5,801,928 A | * | 9/1998 | Burstedt et al. | 361/801 |
| 5,973,926 A | * | 10/1999 | Sacherman et al. | 361/759 |
| 5,978,232 A | * | 11/1999 | Jo | 361/796 |
| 6,233,156 B1 | * | 5/2001 | Liao | 361/759 |

* cited by examiner

Primary Examiner—Kamand Cuneo
Assistant Examiner—Tuan Dinh
(74) Attorney, Agent, or Firm—Wei Te Chung

(57) ABSTRACT

A computer enclosure to receive a circuit board therein comprises a cage, a hook attached to the cage and a pair of ledges attached to the cage. The hook comprises a first body for supporting the circuit board and a latch extending from the first body for engaging with the circuit board. Each ledge comprises a second body for supporting the circuit board and a flange extending from the second body for engaging with the circuit board.

1 Claim, 7 Drawing Sheets

US 6,424,540 B1

COMPUTER ENCLOSURE INCORPORATING MEANS FOR POSITIONING A CIRCUIT BOARD

BACKGROUND OF THE INVENTION

1. FIELD OF THE INVENTION

The present invention is related to a computer enclosure, and particularly to a computer enclosure having means for positioning a circuit board to facilitate fixing the circuit board in the computer enclosure.

2. THE RELATED ART

A computer has many electronic components generally received in a computer enclosure. As the computer industry develops, the requirements for securely, accurately and efficiently assembling the electronic components in the computer enclosure are increasing so as to assure the stability of the computer system and reduce the manufacturing cost of the computer. A mother board is one of the main components of the computer and connects to many other components, such as a central processing unit (CPU) and expansion cards. Conventionally, the mother board is attached to the computer enclosure by bolts, such as those disclosed in Taiwan patent application No. 82108473 and U.S. Pat. No. 5,671,124. During the procedure for fixing the mother board to the computer enclosure, the mother board is positioned in the computer enclosure by hand.

However, positioning the mother board by hand can not assure that the mother board is accurately positioned and securely attached in the computer enclosure. Furthermore, the mother board is subjected to different forces when held in position by bolts, so that a mother board positioned by hand can easily end up out of position. Thus, connectors assembled to the mother board for connecting the mother board to other electronic device may not align with predetermined slots defined in the computer enclosure providing access to the connectors.

Additionally, positioning a mother board by hand is cumbersome and inefficient.

SUMMARY OF THE INVENTION

Accordingly, an object of the present invention is to provide a computer enclosure having means for positioning a circuit board thereby accurately positioning the circuit board in the computer enclosure.

Another object of the present invention is to provide a computer enclosure having means for positioning a circuit board which prevents the circuit board from being subjected to forces which displace the circuit board out of position with respect to the computer enclosure.

A third object of the present invention is to provide a computer enclosure having means for positioning a circuit board which increases the efficiency of assembling the computer.

To achieve the mentioned objects, a computer enclosure that receives a circuit board therein comprises a cage, a hook attached to the cage and a pair of ledges attached to the cage. The hook comprises a first body for supporting the circuit board and a latch extending from the first body for engaging with the circuit board. Each ledge comprises a second body for supporting the circuit board and a flange extending from the second body for engaging with the circuit board.

BRIEF DESCRIPTION OF THE DRAWINGS

Other objects and advantages of the present invention will be understood from the following description of a computer enclosure according to a preferred embodiment of the present invention shown in the accompanying drawings, in which.

DETAILED DESCRIPTION OF THE PREFERRED EMBODIMENT

Figure 1:
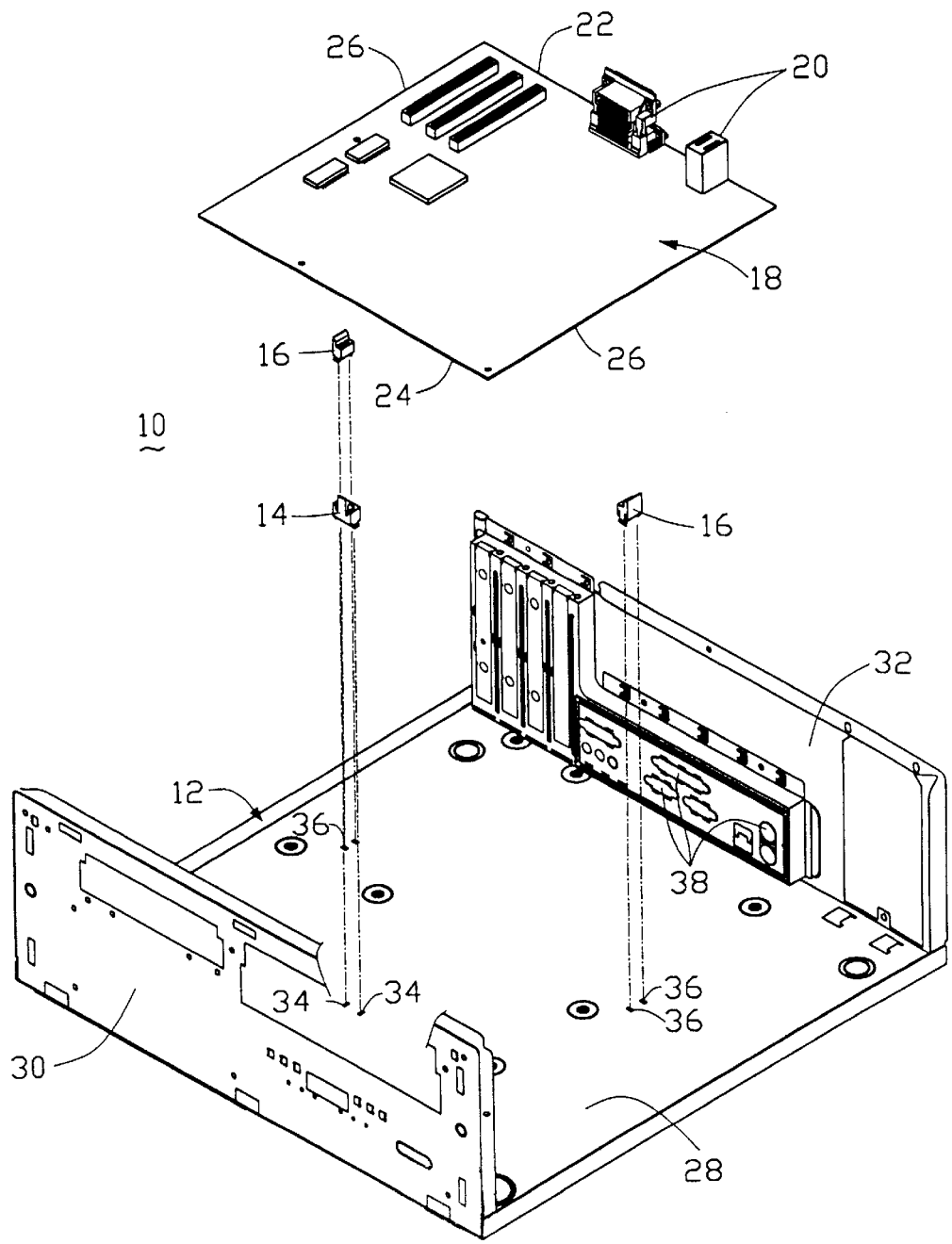
FIG. 1 is an exploded view of a computer enclosure of the present invention and a circuit board to be attached thereto.

Referring to FIG. 1, a computer enclosure 10 of the present invention includes a cage 12, a hook 14 and a pair of ledges 16. The hook 14 and the ledges 16 are attached to the cage 12 for positioning a circuit board 18 in the cage 12. A plurality of connectors 20 is assembled on the circuit board 18 along a rear edge 22 thereof. The circuit board 18 includes a front edge 24 and a pair of side edges 26. The cage 12 includes a base 28 and front and rear panels 30, 32 extending from opposite edges thereof. A pair of first apertures 34 is defined in the base 28 of the cage 12 parallel to the front panel 30. Two pairs of second apertures 36 are defined in the base 28 of the cage 12 substantially perpendicular to the front panel 30. A plurality of slots 38 is defined in the rear panel 32 for providing access to the connectors 20 of the circuit board 18. It should be noted that a portion of the front panel 30 is cut away for showing the first apertures 34 in FIG. 1.

Figure 2:
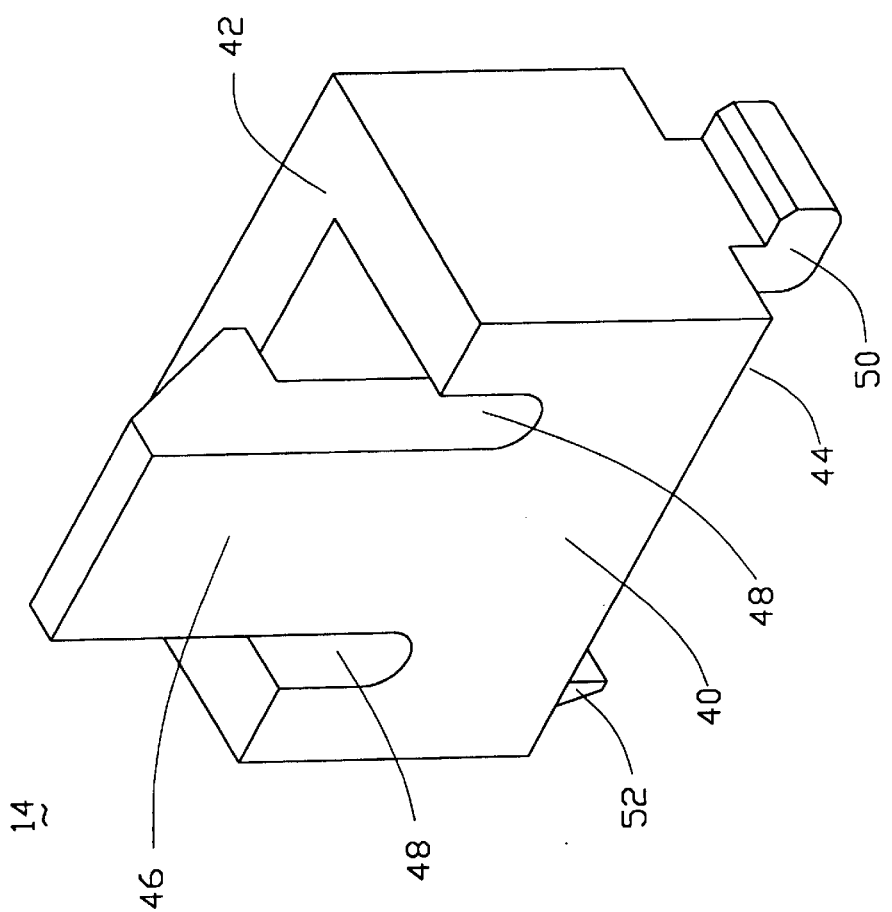
FIG. 2 is a perspective view of a hook of FIG. 1.
Figure 3:
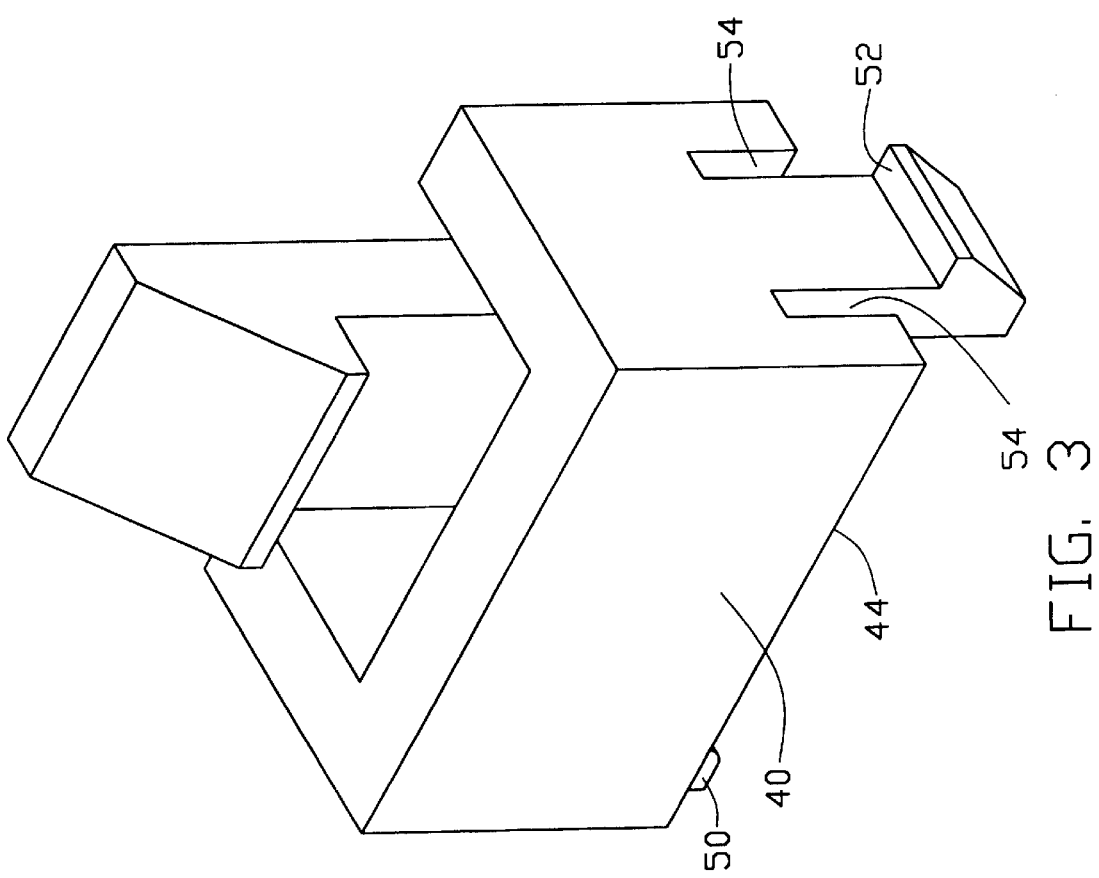
FIG. 3 is similar to FIG. 2 showing the hook from another angle.

Referring to FIGS. 1 and 2, the hook 14 includes a first body 40 forming a first top interface 42 and a first bottom interface 44. A latch 46 extends from the first top interface 42 of the first body 40 for engaging with the front edge 24 of the circuit board 18. A pair of notches 48 is defined in the first body 40 and at opposite sides of the latch 46 for facilitating bending of the latch 46. A first foot 50 extends from the first bottom interface 44 of the first body 40 for engaging with the first aperture 34 of the cage 12. Also referring to FIG. 3, a first tache 52 extends from the first bottom interface 44 opposite the first foot 50 for engaging with the first aperture 34 of the cage 12. A pair of first gaps 54 is defined in the first body 40 and at opposite sides of the first tache 52 for increasing the resiliency of the first tache 52.

Figure 4:
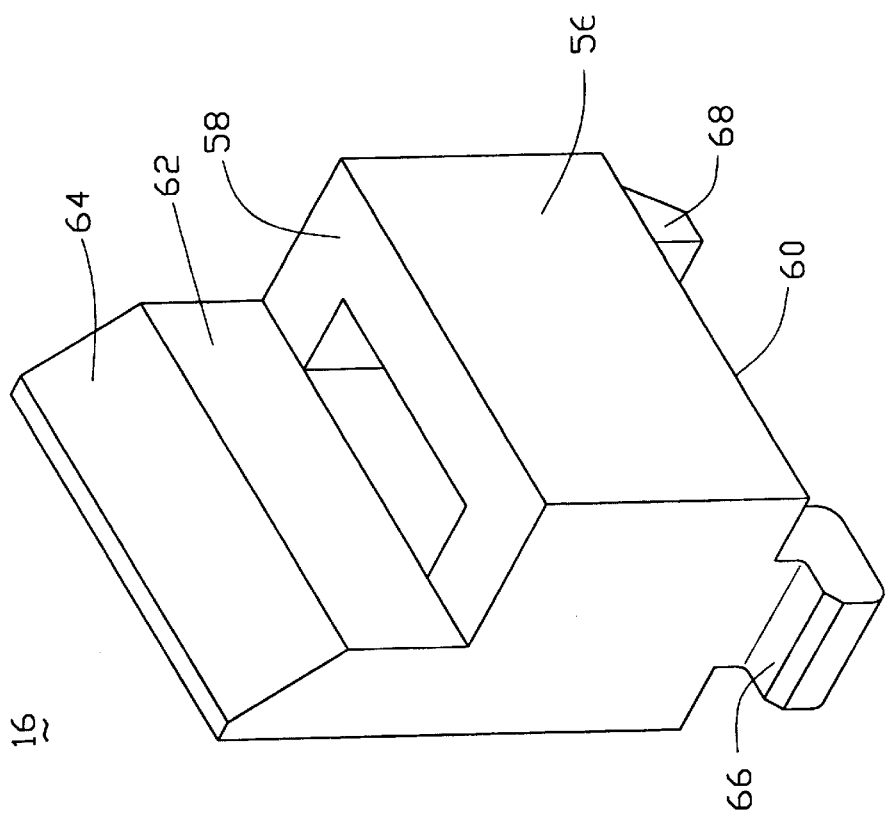
FIG. 4 is a perspective view of a ledge of FIG. 1.
Figure 5:
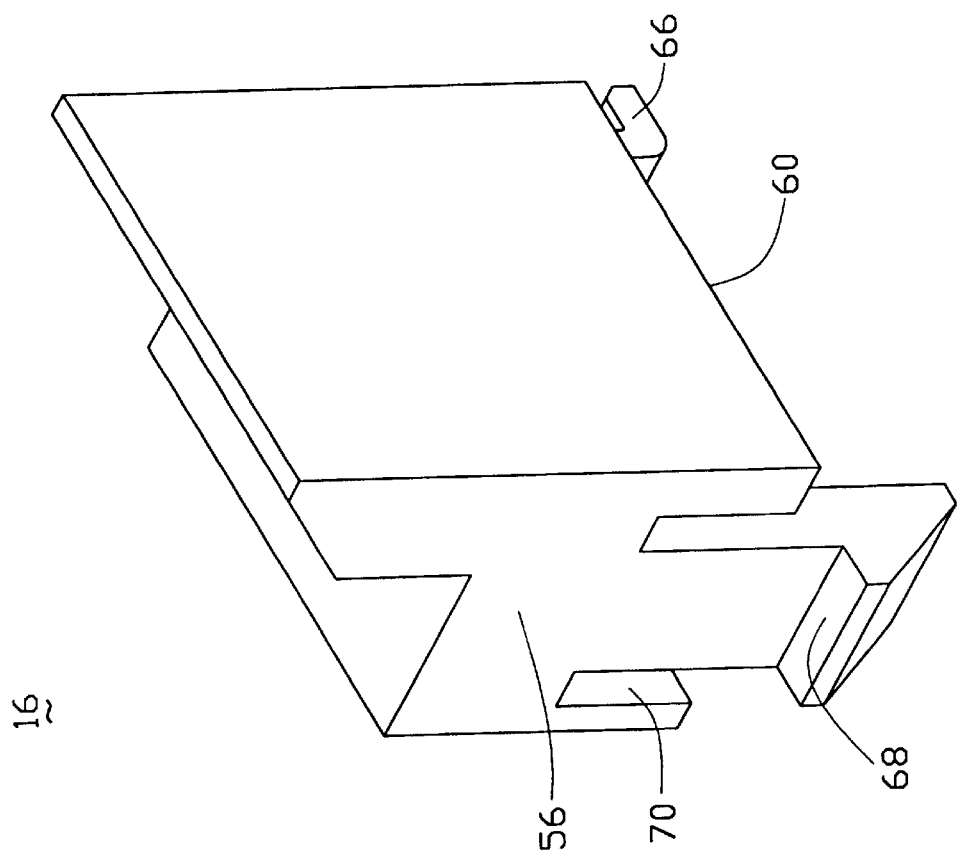
FIG. 5 is similar to FIG. 4 showing the ledge viewed from another angle.

Referring to FIGS. 1 and 4, the ledge 16 includes a second body 56 forming a second top interface 58 and a second bottom interface 60. A flange 62 extends from the second top interface 58 of the second body 56 for abutting against the side edge 26 of the circuit board 18. A guiding surface 64 is formed at the top of the flange 62 for facilitating assembling the circuit board 18. A second foot 66 extends from the second bottom interface 60 of the second body 56 for engaging with the second aperture 36 of the cage 12. Also referring to FIG. 5, a second tache 68 extends from the second bottom interface 60 opposite the second foot 66 for engaging with the second aperture 36 of the cage 12. A pair of second gaps 70 is defined in the second body 56 and at opposite sides of the second tache 68 for increasing the resiliency of the second tache 68.

Figure 6:
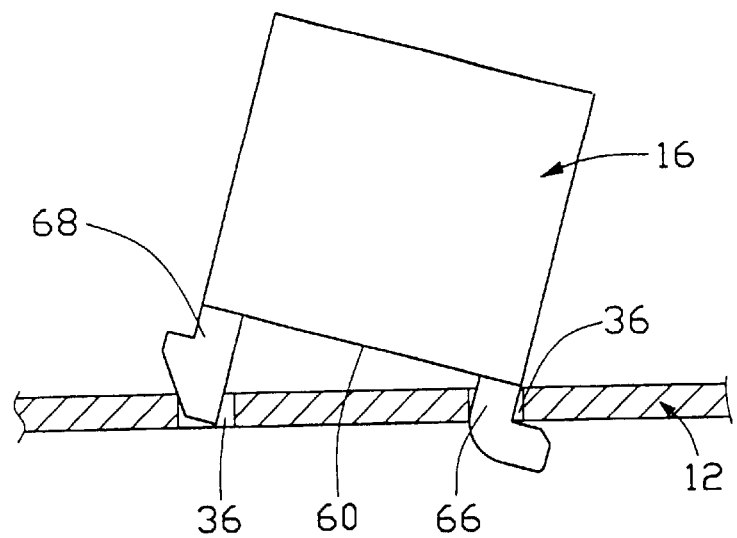
FIG. 6 is a schematic view of the ledge and the circuit board showing the ledge partially attached to the circuit board.
Figure 7:
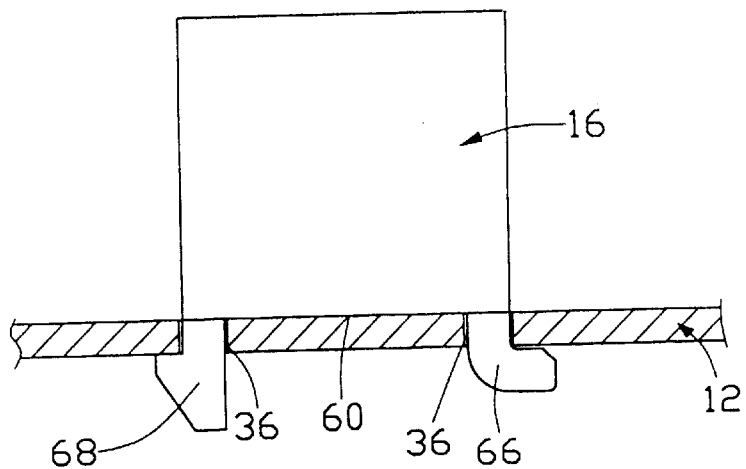
FIG. 7 is similar to FIG. 6 showing the ledge assembled to the circuit board.

FIGS. 6 and 7 illustrate assembly of the ledge 16 to the cage 12, which is the same as the assembly of the hook 14 to the cage 12. The second foot 66 of the ledge 16 is first extended through one aperture 36 of the cage 12, engaging with the cage 12. Then the second tache 68 of the ledge 16 is flexibly extended through the other aperture 36 of the cage 12 and engages with the cage 12 with the second bottom interface 60 of the ledge 16 abutting against the cage 12. Thus, the ledge 16 is securely attached to the cage 12.

Figure 8:
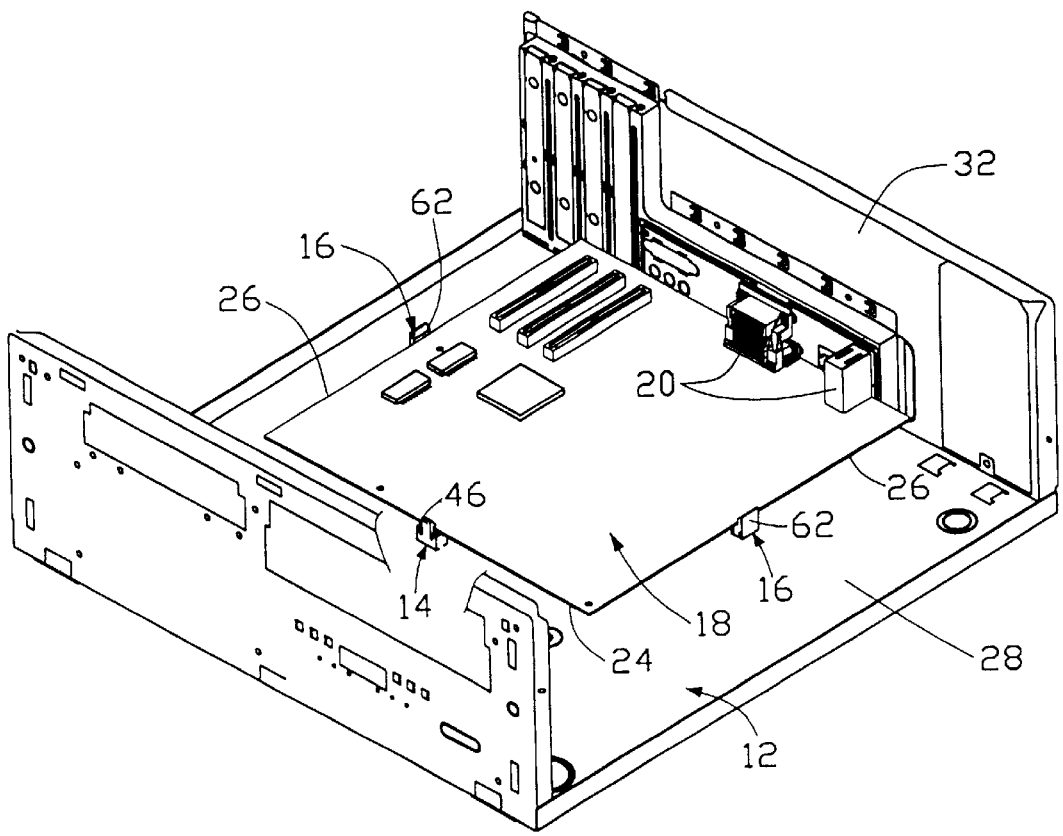
FIG. 8 is an assembled view of FIG. 1.

Referring to FIGS. 1 and 8, the hook 14 and the ledges 16 are attached to the cage 12 with the first and the second top interfaces 42, 58 thereof (See FIGS. 2 and 4) situated at a same level. The connectors 20 of the circuit board 18 are aligned with the slots 38 of the rear panel 32. The circuit board 18 is supported on the first and the second top interfaces 42, 58. The side edges 26 of the circuit board 18 are secured between the flanges 62 of the ledges 16 and the front edge 24 of the circuit board 18 is engaged with the latch 46 of the hook 14. Thus, the circuit board 18 is readily, accurately and securely positioned in the cage 12.

It is understood that the invention may be embodied in other forms without departing from the spirit thereof. Thus, the present examples and embodiments are to be considered in all respects as illustrative and not restrictive, and the invention is not to be limited to the details given herein.

What is claimed is:

1. A computer enclosure adapted to receive a circuit board therein, comprising:

a cage defining a pair of first apertures and two pairs of second apertures;

a hook attached to the cage for engaging with the circuit board, the hook comprising a first body for supporting the circuit board, a first foot and a first tache extending from the first body of the hook for engaging with the first apertures of the cage thereby fixing the hook to the cage, a latch extending from the first body of the hook and a pair of notches being defined at opposite sides of the latch of the hook for increasing the resiliency of the latch; and a pair of ledges attached to the cage, each ledge comprising a second body for supporting the circuit board, a second foot and a second tache extending from the second body of each ledge for engaging with the second apertures of the cage thereby fixing each ledge to the cage.

\* \* \* \* \*